(12) United States Patent
Sawano

(10) Patent No.: US 6,329,739 B1
(45) Date of Patent: *Dec. 11, 2001

(54) SURFACE-ACOUSTIC-WAVE DEVICE PACKAGE AND METHOD FOR FABRICATING THE SAME

(75) Inventor: Masayuki Sawano, Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/302,422

(22) Filed: Apr. 30, 1999

(30) Foreign Application Priority Data

Jun. 16, 1998 (JP) .................................. 10-168041
Jun. 16, 1998 (JP) .................................. 10-168042

(51) Int. Cl.[7] .................................................. H01L 41/04
(52) U.S. Cl. ...................................... 310/313 R; 310/348
(58) Field of Search .......................... 310/313 R, 313 A, 310/313 B, 313 D, 340, 348, 313; 333/193

(56) References Cited

U.S. PATENT DOCUMENTS

| | | | |
|---|---|---|---|
| 4,500,807 | * 2/1985 | Yuhara et al. | 310/313 B |
| 4,628,146 | * 12/1986 | Schmotz et al. | 174/52 PE |
| 4,656,385 | * 4/1987 | Tanaka | 310/348 |
| 5,390,401 | * 2/1995 | Shikata et al. | 29/25.35 |
| 5,818,145 | * 10/1998 | Fukiharu | 310/313 R |
| 5,920,142 | * 7/1999 | Onishi et al. | 310/313 R |
| 5,969,461 | * 10/1999 | Anderson et al. | 310/313 R |

* cited by examiner

Primary Examiner—Nestor Ramirez
Assistant Examiner—Peter Medley
(74) Attorney, Agent, or Firm—Rabin & Berdo, P.C.

(57) ABSTRACT

A surface-acoustic-wave device package includes a cover film which covers a piezoelectric substrate to provide an air gap around the functional surface of the surface-acoustic-wave device. The surface-acoustic-wave device package also includes a seal material which is provided over the cover film to seal the surface-acoustic-wave device.

13 Claims, 17 Drawing Sheets

SURFACE-ACOUSTIC-WAVE DEVICE PACKAGE AND METHOD FOR FABRICATING THE SAME

CROSS REFERENCE TO RELATED APPLICATION

This application claims the priority of Applications No. H10-168041 and No. H10-168042, both filed Jun. 16, 1998 in Japan, the subject matter of which is incorporated herein by reference.

TECHNICAL FIELD OF THE INVENTION

The present invention relates to a surface-acoustic wave (SAW) device package, which is effectual to miniaturize itself. The present invention also relates to a method for packaging a surface-acoustic-wave device, which is effectual to miniaturize the package.

BACKGROUND OF THE INVENTION

In recent years, personal communication devices, such as mobile phones, have been remarkably improved. For personal communication devices, high frequency analog devices became more important than ever. For manufacturing a personal communication device to be small in size, surface-acoustic-wave (SAW) devices are useful. For example, surface-acoustic-wave devices are used for filters, resonator and the like.

A conventional surface-acoustic-wave (SAW) device includes a transducer, which converts an electric signal into acoustic waves or converts acoustic waves into an electric signal. Such a transducer may be made of a piezoelectric material. The piezoelectric material produces a mechanical distortion in response to application of voltage. In reverse, the piezoelectric material generates electric polarization as a result of the application of mechanical stress. Usually, as piezoelectric crystal, quartz, lithium niobate ($LiNbO_3$) and lithium tantalate ($LiTaO_3$) is used.

A conventional SAW transversal filter includes a piezoelectric substrate and IDTs (Interdigital Transducers). When an input signal is applied to one IDT, a mechanical distrotion is generated with a certain frequency and surface-acoustic-waves are generated on the surface of the piezoelectric substrate. The surface-acoustic waves travel on the surface of the piezoelectric substrate to another IDT, and aer converted into an electrical signal.

The surface-acoustic-wave device can be mounted on a base substrate in the same manner as an LSI, using wire-bonding technique. In packaging process, it is required to have an air gap around the functional surface of the piezoelectric substrate. For example, the piezoelectric substrate is mounted in a cavity of a base substrate, and a seal lid is provided to make the air gap above the piezoelectric substrate.

According to the above described conventional technology, it is difficult to package a surface-acoustic-wave device in a small space with lower cost.

OBJECTS OF THE INVENTION

Accordingly, an object of the present invention is to provide a surface-acoustic-wave device package which can be miniaturized easily.

Another object of the present invention is to provide a method for packaging a surface-acoustic-wave device in a small space.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to an aspect of the present invention, a surface-acoustic-wave device package includes a cover film which covers a surface-acoustic-wave device to provide an air gap around the functional surface thereof. The air gap allows surface acoustic waves travel on the functional surface securely. The surface-acoustic-wave device package also includes a seal material which is provided over the cover film to seal the surface-acoustic-wave device.

According to another aspect of the present invention, a method for packaging a surface-acoustic-wave device including the steps of: mounting the surface-acoustic-wave device on a base substrate; covering the surface-acoustic-wave device with a cover film to make an air gap around the functional surface; and sealing the surface-acoustic-wave device covered with the cover film.

According to a further aspect of the present invention, a surface-acoustic-wave device package includes first to Nth surface-acoustic-wave (SAW) device layers, which are piled up. The first SAW device layer is mounted on the base substrate. The first SAW device layer includes a first SAW device that is provided with a functional surface, on which surface acoustic waves travel along, and with a bottom surface connected to the base substrate. The Nth SAW device layer, in which "N" represents a whole number larger than one, is piled up on the (N–1)th SAW device layer. The Nth SAW device layer includes an Nth SAW device that is provided with a functional surface, on which surface acoustic waves travel along. The SAW device package further includes a seal lid which is arranged over the Nth SAW device layer to provide a sealed air gap above the functional surface of the Nth SAW device. The bottom surface of the Nth surface-acoustic-wave device functions as a seal to provide a sealed air gap above the functional surface of the (N–1)th SAW device.

According to the present invention, a surface-acoustic-wave device can be packaged in a small space easily with low costs.

DETAILED DISCLOSURE OF THE INVENTION

Figure 1A:
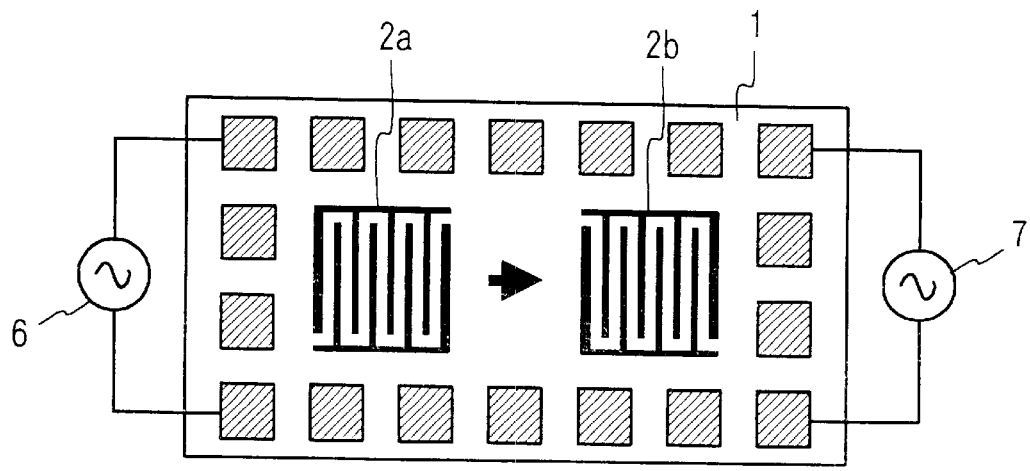
FIG. 1A is a plane view illustrating a conventional surface-acoustic-wave device.
Figure 1B:
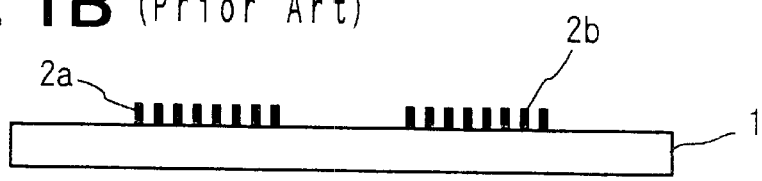
FIG. 1B is a front (side) view showing the conventional surface-acoustic-wave device shown in FIG. 1A.
Figure 2:
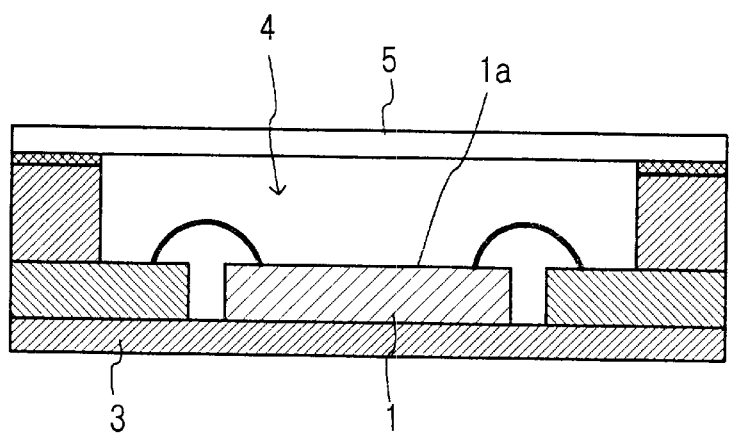
FIG. 2 is a cross-sectional view illustrating a package of the conventional surface-acoustic-wave device shown in FIGS. 1A and 1B.

For better understanding of the present invention, a conventional technology is first described. FIGS. 1A and 1B show a conventional SAW (Surface-Acoustic-Wave) transversal filter. FIG. 2 shows a packaging structure of the filter, shown in FIGS. 1A and 1B. As shown in those drawings, the SAW transversal filter includes a piezoelectric substrate (SAW device) 1 and IDTs (Interdigidal Transducers) 2a and 2b. The piezoelectric substrate 1 produces piezoelectric effect.

When an input signal 6 is applied to the IDT 2a, a mechanical distortion is generated with a certain frequency and surface-acoustic-waves are generated on a functional surface 1a of the piezoelectric substrate 1. On the functional surface 1a of the piezoelectric substrate 1, the surface-acoustic-waves travel from the IDT 2a to the other IDT 2b. The IDT 2b converts the surface-acoustic-waves into an electric signal, which is an output signal 7. The wavelength λ of the surface-acoustic-waves are determined so that the frequency f0 (=v/2d, v: velocity of surface wave) becomes equal to the electrode cycle 2d of the IDTs 2a and 2b. The surface-acoustic-waves, generated by each electrode, travel in the same phase, so that traveling sensitivity is optimized.

The SAW filter can be mounted on a base substrate in the same manner as an LSI, using wire-bonding technique. In packaging process of the SAW filter, it is required to have an air gap 4 above the functional surface 1a of the piezoelectric substrate 1. For example, the piezoelectric substrate 1 is mounted in a cavity of a base substrate 3, and a seal lid 5 is provided to make the air gap 4 above the piezoelectric substrate 1. This kind of mounting method is described in a publication "Design of Communication Filter Circuit and Applications", published by Sogo-Densi-Shuppan.

According to the above described conventional technology, it is difficult to package a surface-acoustic-wave device in a small space, because it is required to make an air gap therein. It costs a lot for packaging of the conventional surface-acoustic-wave device.

Figure 3:
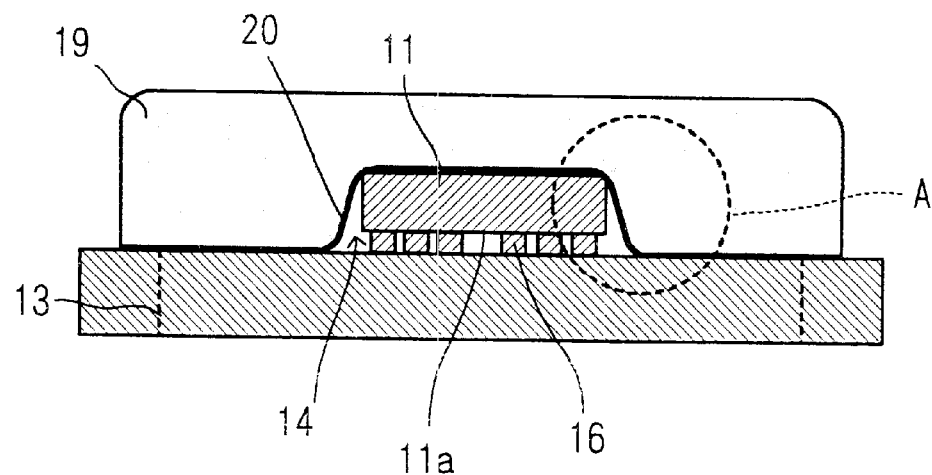
FIG. 3 is a cross-sectional view illustrating a surface-acoustic-wave device package according to a first preferred embodiment of the present invention.
Figure 4:
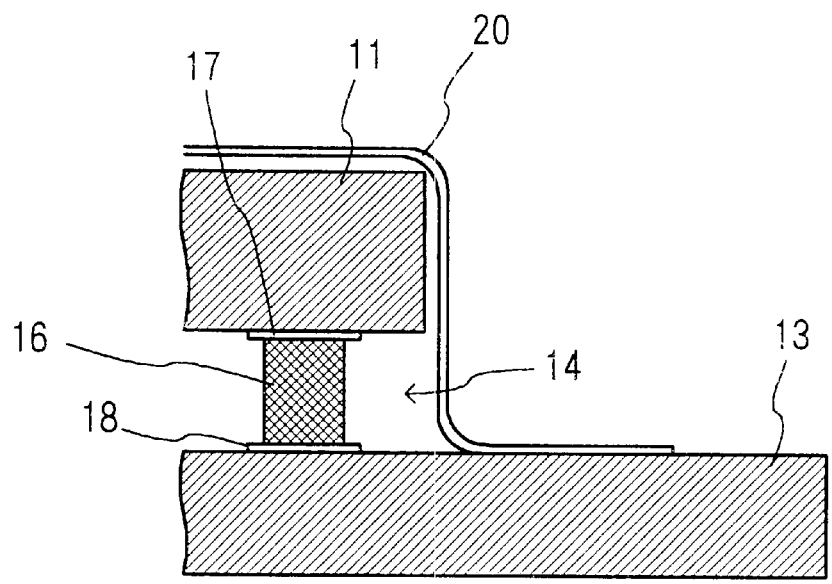
FIG. 4 is an enlarged cross-sectional view showing a region "A" in FIG. 3.
Figure 5:
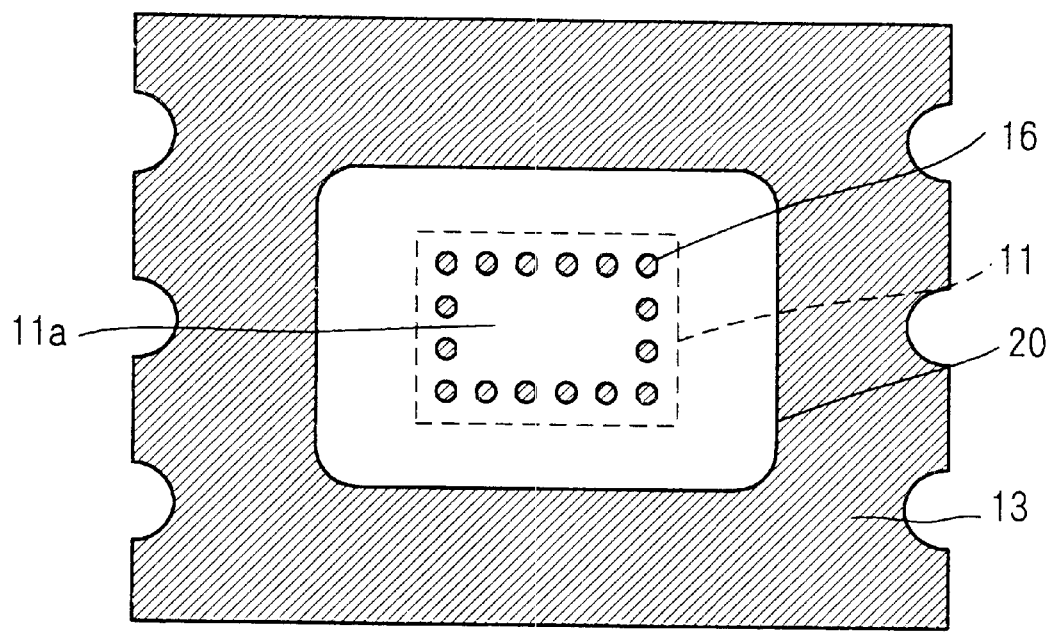
FIG. 5 is a plan view (partly cross section) showing the surface-acoustic-wave device package of the first preferred embodiment, shown in FIG. 3.

FIG. 3 is a cross-sectional view showing a surface-acoustic-wave (SAW) device package according to a first preferred embodiment of the present invention. FIG. 4 is an enlarged cross-sectional view showing portion "A" of the surface-acoustic-wave device package, shown in FIG. 3. FIG. 5 is a plan view showing the surface-acoustic-wave device package, shown in FIG. 3. The SAW device package includes a piezoelectric substrate (SAW device) 11, a cover film 20 and a seal material 19. The piezoelectric substrate 11 is connected to a base substrate 13 via connecting members 16.

The piezoelectric substrate 11 is mounted on the base substrate 13 in accordance with bump bonding technology. The connecting members 16 may be made of solder or gold (Au). The piezoelectric substrate 11 is faced down to the base substrate 13 so that a functional surface 11a faces the base substrate 13. The piezoelectric substrate 11, mounted on the base substrate 13, is sealed with the seal material 19 to generate an air gap 14 around the functional surface 11a.

It is important that the seal material 19 does not get into the room between the functional surface 11a of the piezoelectric substrate 11 and the base substrate 13. According to this embodiment, the cover film 20 is arranged between the piezoelectric substrate 11 and the seal material 19. The cover film 20 is provided over the piezoelectric substrate 11 so as to cover the SAW device (11) entirely. The cover film 20 is heated to be fixed onto the base substrate 13.

The cover film 20 prevents the seal material 19 from coming into the room between the functional surface 11a of the piezoelectric substrate 11 and the base substrate 13 to secure the air gap 14. Preferably, the cover film 20 is pre-fixed to the base substrate 13 before the heat treatment. For example, the cover film 20 is originally adhesive, or the edge of the cover film 20 is pre-fixed to the base substrate 13 with heat treatment.

Preferably, the cover film 20 is made of a resin that is softened and shrunk with heat. The heat treatment should be carried out with a temperature that does not allow the cover film 20 to melt. For instance, the cover film 20 is made of a vinyl resin, which is softened with a temperature around 50° C. The vinyl resin can be fixed to the base substrate 13 with a temperature of 60° C. to 70° C.

An adhesive film can be used as the cover film 20. For example, the cover film 20 may be made of a material including a bonded fabric of polyester, into which acrylic resin is permeated. Such a film is set with a temperature of around 100° C. and fixed onto the base substrate 13 securely. When using a bonded fabric as the cover film 20, the adhesives does not come into the room between the piezoelectric substrate 11 and the base substrate 13.

In FIG. 4, reference numerals 17 and 18 represent an input/output terminal and a connecting pad, respectively.

As described above, according to the first preferred embodiment of the present invention, the air gap can be made easily, so that the cost for packaging can be reduced. Further, the SAW device (11) is mounted onto the base substrate 13 with the face-down bonding technique, so that the SAW device (11) can be packaged in a small space.

Figure 6:
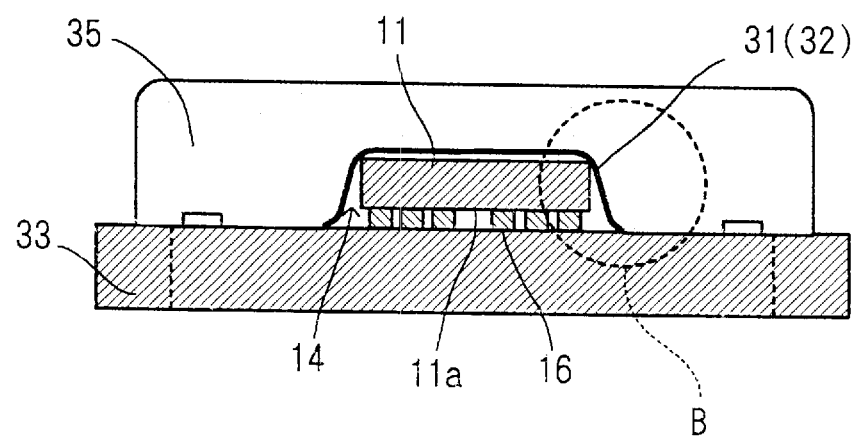
FIG. 6 is a cross-sectional view illustrating a surface-acoustic-wave device package according to a second preferred embodiment of the present invention.
Figure 7:
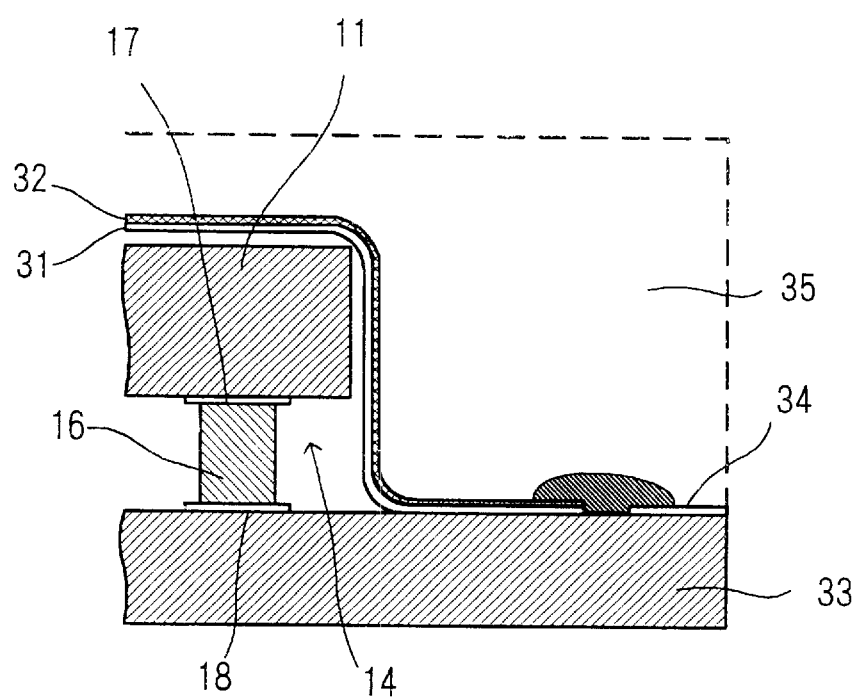
FIG. 7 is an enlarged cross-sectional view showing a region "B" in FIG. 6.

FIG. 6 is a cross-sectional view showing a surface-acoustic-wave device package according to a second preferred embodiment of the present invention. FIG. 7 is an enlarged cross-sectional view showing portion "B" in FIG. 6. In this embodiment, the same or corresponding elements to those in the above described first preferred embodiment are represented by the same reference numerals. And the same explanation is not repeated to avoid a redundant description.

The SAW device package of the second preferred embodiment includes a piezoelectric substrate (SAW device) 11, a cover film 31 and a seal material 35. The piezoelectric substrate 11 is connected to a base substrate 33 via connecting members 16.

The piezoelectric substrate 11 is faced down to the base substrate 33 so that a functional surface 11a faces the base substrate 13. The piezoelectric substrate 11, mounted on the base substrate 33, is sealed with the seal material 35 to generate an air gap 14 around the functional surface 11a.

According to this embodiment, the cover film 31 is arranged between the piezoelectric substrate 11 and the seal material 35. The cover film 31 is provided over the piezoelectric substrate 11 so as to cover the SAW device entirely. The cover film 31 is heated to be fixed onto the base substrate 33. The cover film 31 prevents the seal material 35 from coming into the room between the functional surface 11a of the piezoelectric substrate 11 and the base substrate 33 to secure the air gap 14.

The characterizing feature of the embodiment is a conductive layer 32 formed on the cover film 31. The conductive layer 32 is electrically connected to a ground pattern 34, formed on the base substrate 33. The conductive layer 32, for example, is formed by spraying conductive coatings on, or by applying chemical plating to the outside surface of the cover film 31.

In addition to the advantages of the first preferred embodiment, according to the second preferred embodiment of the present invention, the cover film 31 can be grounded easily.

Figure 8:
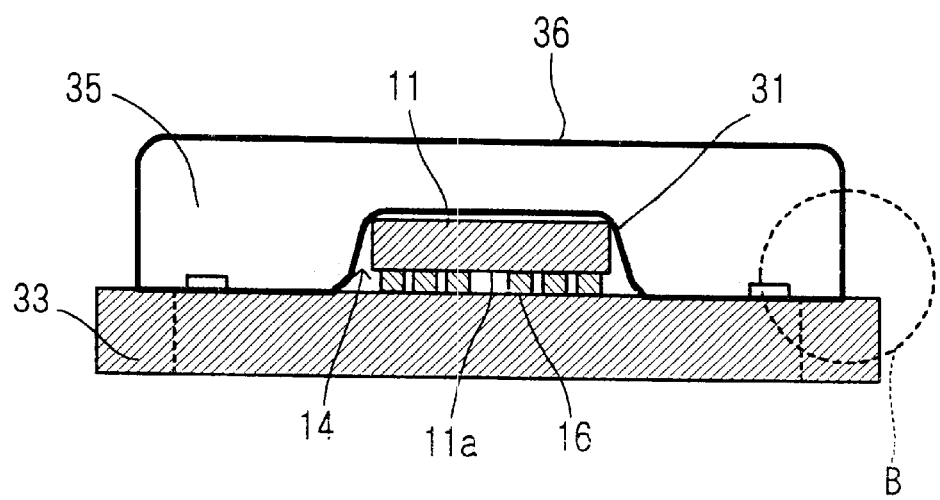
FIG. 8 is a cross-sectional view illustrating a surface-acoustic-wave device package according to a third preferred embodiment of the present invention.
Figure 9:
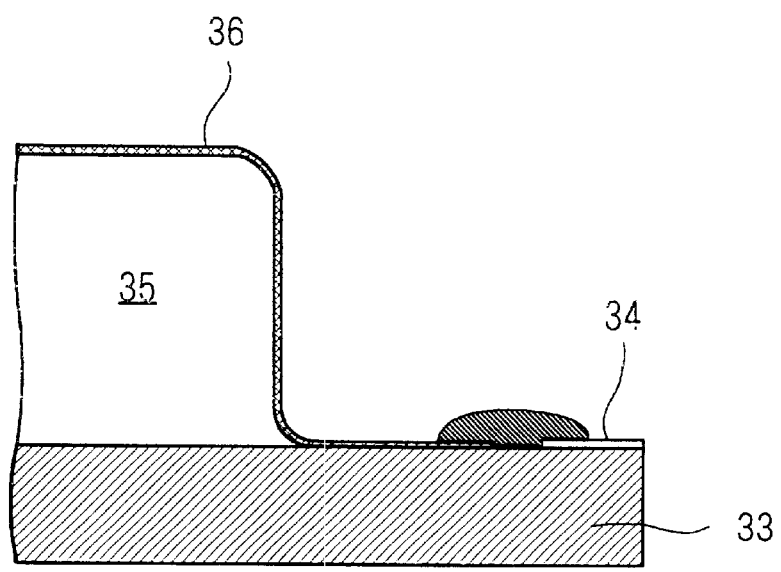
FIG. 9 is an enlarged cross-sectional view showing a region "C" in FIG. 8.

FIG. 8 is a cross-sectional view showing a surface-acoustic-wave device package according to a third preferred embodiment of the present invention. FIG. 9 is an enlarged cross-sectional view showing a portion "B" in FIG. 8. In this embodiment, the same or corresponding elements to those in the above described first and second preferred embodiments are represented by the same reference numerals. And the same explanation is not repeated to avoid a redundant description.

The feature of the embodiment is that a conductive layer 36 is formed on the seal material 35. The conductive layer 36 is electrically connected to a ground pattern 34, formed on the base substrate 33. The conductive layer 36 may be formed by evaporating or sputtering a conductive material to the outside surface of the seal material 35.

In addition to the advantages of the first preferred embodiment, according to the second preferred embodiment of the present invention, the seal material 35 can be grounded easily.

Figure 10:
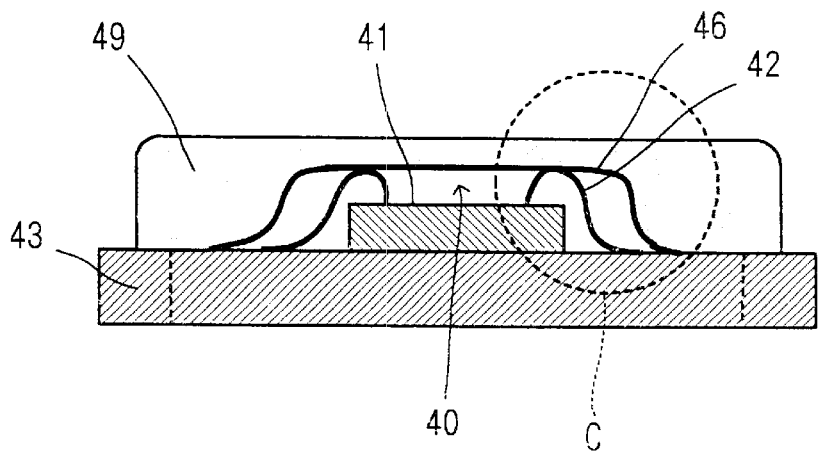
FIG. 10 is a cross-sectional view illustrating a surface-acoustic-wave device package according to a fourth preferred embodiment of the present invention.
Figure 11:
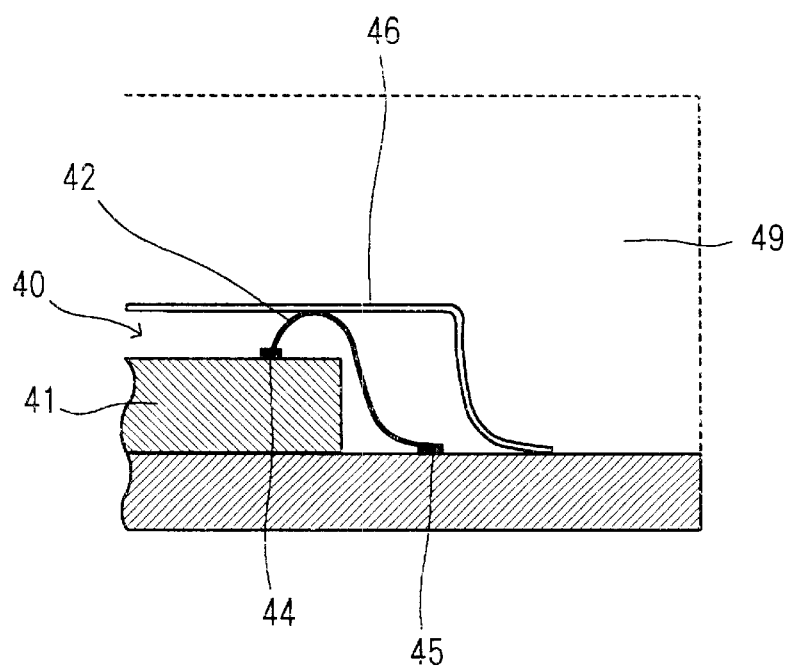
FIG. 11 is an enlarged cross-sectional view showing a region "C" in FIG. 10.

FIG. 10 is a cross-sectional view showing a surface-acoustic-wave device package according to a fourth preferred embodiment of the present invention. FIG. 11 is an enlarged cross-sectional view showing a portion "C" in FIG. 10.

The SAW device package of this embodiment includes a piezoelectric substrate (SAW device) 41, a cover film 46 and a seal material 49. The piezoelectric substrate 41 is connected to a base substrate 43 using bonding wires 42 with wire-bonding technique. In FIG. 11, a reference numeral 44 represents connecting pads ($1^{st}$ bonding portions) arranged on the edge of the functional surface of the piezoelectric substrate 41. The connecting pads 44 are connected via the bonding wires 42 to connecting pads ($2^{nd}$ bonding portions) 45 on the base substrate 43.

The piezoelectric substrate 41, mounted on the base substrate 43, is sealed with the seal material 49 to generate an air gap 40 above the functional surface of the piezoelectric substrate 41.

According to this embodiment, the cover film 46 is arranged between the piezoelectric substrate 41 and the seal material 49. The cover film 46 is provided over the piezoelectric substrate 41 so as to cover the SAW device (41) entirely. The cover film 46 is heated to be fixed onto the base substrate 43. The cover film 46 secures the air gap 40 provided above the piezoelectric substrate 41.

Figure 12A:
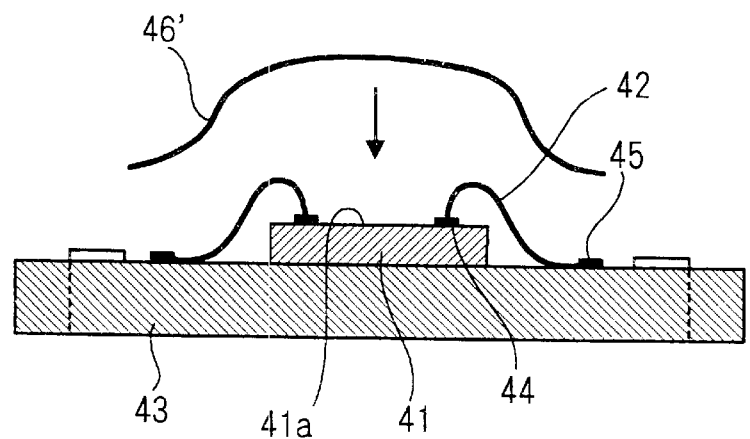
FIGS. 12A to 12C are cross sectional views used for describing packaging steps of the surface-acoustic-wave device package of the fourth preferred embodiment, shown in FIG. 10.
Figure 12B:
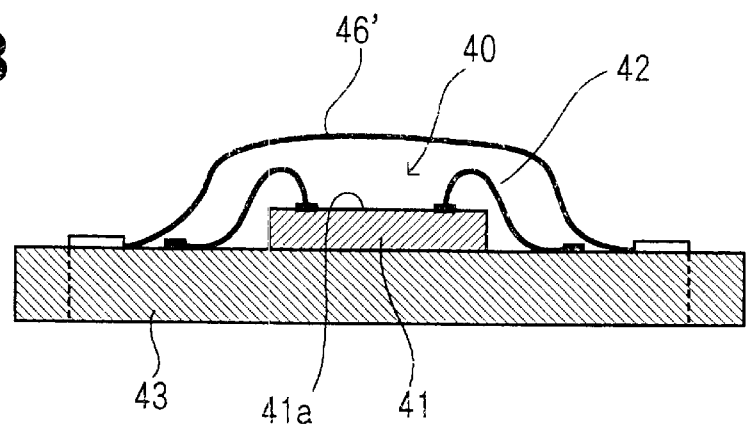
Figure 12C:
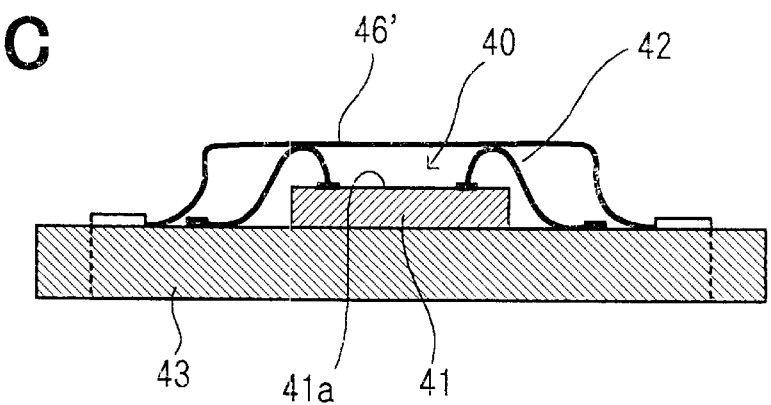

FIGS. 12A to 12C are cross-sectional view showing packaging steps of the surface-acoustic-wave device package, shown in FIG. 10. In packaging process, a cup-shaped film 46' is provided and is aligned above the functional surface 41a of the piezoelectric substrate 41, as shown in FIG. 12A.

Next, as shown in FIG. 12B, the cup-shaped film 46' is put over the piezoelectric substrate 41, which is connected to the base substrate 43 using the bonding wires 42. Then the cup-shaped film 46' is pre-fixed onto the base substrate 43. As a result, the air gap 40 is formed above the functional surface 41a of the piezoelectric substrate 41.

Next, as shown in FIG. 12C, the cup-shaped film 46' is heated to be fixed onto the base substrate 43 completely to form the cover film 46. After that, the piezoelectric substrate 41 is sealed with the seal material 49.

According to this embodiment, the cup-shaped film 46' is shaped not to touch the bonding wires 42, so that the bonding wires 42 are not crushed with the film 46'. The cup-shaped film 46' is pre-heated at the edge to be pre-fixed onto the base substrate 43, then the film 46' is entirely heated. When the cup-shaped film 46' is entirely heated, the film 46' is melted and shrunk uniformly, so that the bonding wires 42 are prevented from being crushed with the film 46'. If there is no possibility that the bonding wires are crushed, it is not required to shape a cover film to be like a cup. The piezoelectric substrate 41 can be sealed with the seal material 49 in the same manner as the second preferred embodiment.

According to the fourth preferred embodiment of the present invention, the air gap 40 can be formed easily and securely. Therefore, the packaging cost can be reduced. Further, the surface-acoustic-wave device package of this embodiment uses no seal lid that needs a supporting member not to crush bonding wires. As a result, the package can be formed to have a lower height.

Figure 13:
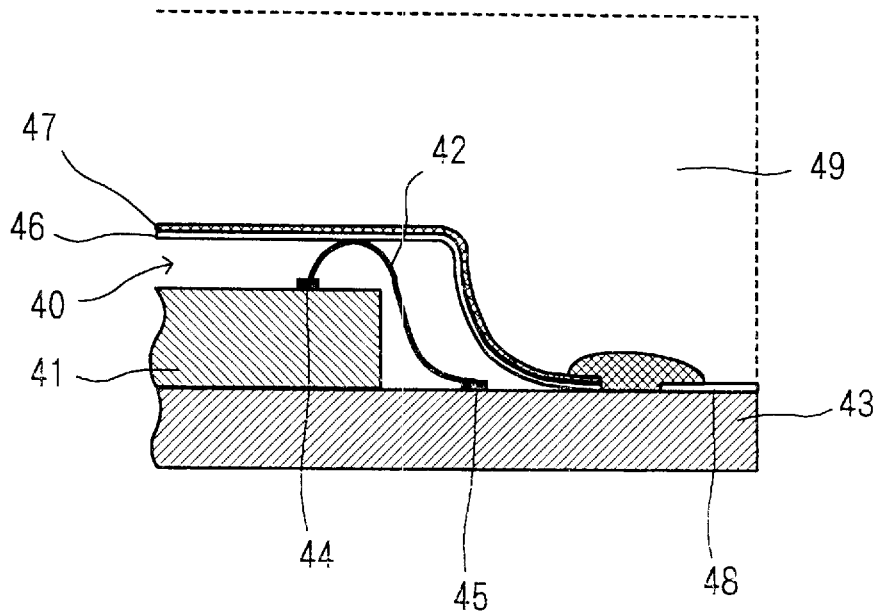
FIG. 13 is an enlarged cross-sectional view showing a part of a surface-acoustic-wave device package according to a fifth preferred embodiment of the present invention.

FIG. 13 is a cross-sectional view showing a part of a surface-acoustic-wave device package according to a fifth preferred embodiment of the present invention. This embodiment is created by modifying the above described fourth preferred embodiment. In this embodiment, the same or corresponding elements to those in the fourth preferred embodiment are represented by the same reference numerals. And the same explanation is not repeated to avoid a redundant description.

The feature of the fifth preferred embodiment is that a conductive layer 47 is formed on the cover film 46. The conductive layer 47 is electrically connected to a ground pattern 48, formed on the base substrate 43. The conductive layer 47, for example, is formed by spraying conductive coatings or by chemical plating to the outside surface of the cover film 46.

In addition to the advantages of the fourth preferred embodiment, according to the fifth preferred embodiment of the present invention, the cover film 46 can be grounded easily.

Figure 14:
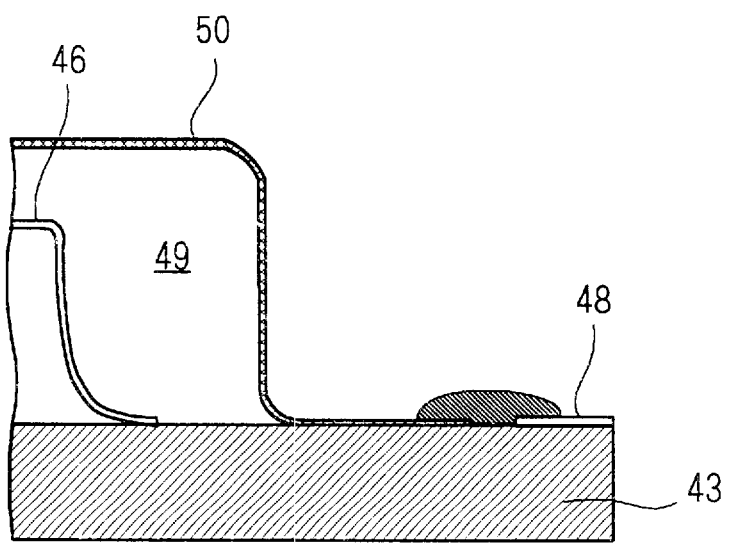
FIG. 14 is an enlarged cross-sectional view showing a part of a surface-acoustic-wave device package according to a sixth preferred embodiment of the present invention.

FIG. 14 is a cross-sectional view showing a part of a surface-acoustic-wave device package according to a sixth preferred embodiment of the present invention. This embodiment is created by modifying the above described fourth preferred embodiment. In this embodiment, the same or corresponding elements to those in the fourth preferred embodiment are represented by the same reference numerals. And the same explanation is not repeated to avoid a redundant description.

The feature of the embodiment is that a conductive layer 50 is formed on the seal material 49. The conductive layer 50 is electrically connected to a ground pattern 48, formed on the base substrate 43. The conductive layer 50 may be formed by evaporating or sputtering a conductive material to the outside surface of the seal material 49.

In addition to the advantages of the fourth preferred embodiment, according to the sixth preferred embodiment of the present invention, the seal material 50 can be grounded easily.

Figure 15:
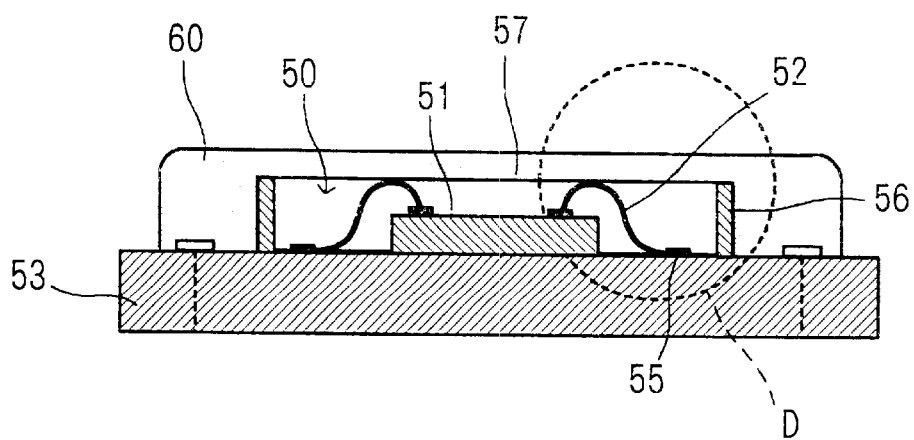
FIG. 15 is a cross-sectional view illustrating a surface-acoustic-wave device package according to a seventh preferred embodiment of the present invention.
Figure 16:
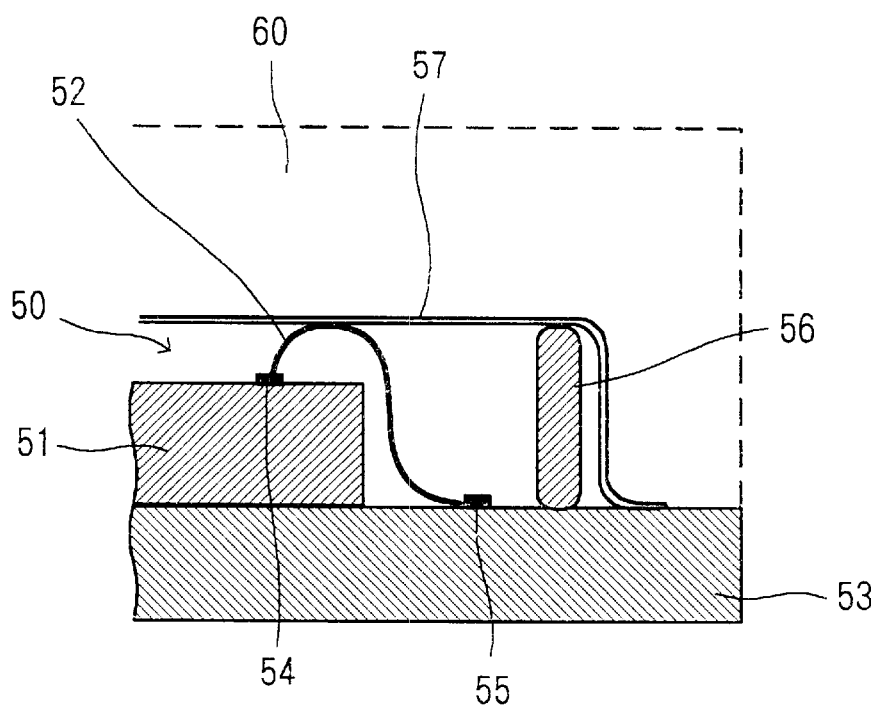
FIG. 16 is an enlarged cross-sectional view showing a region "D" in FIG. 15.
Figure 17:
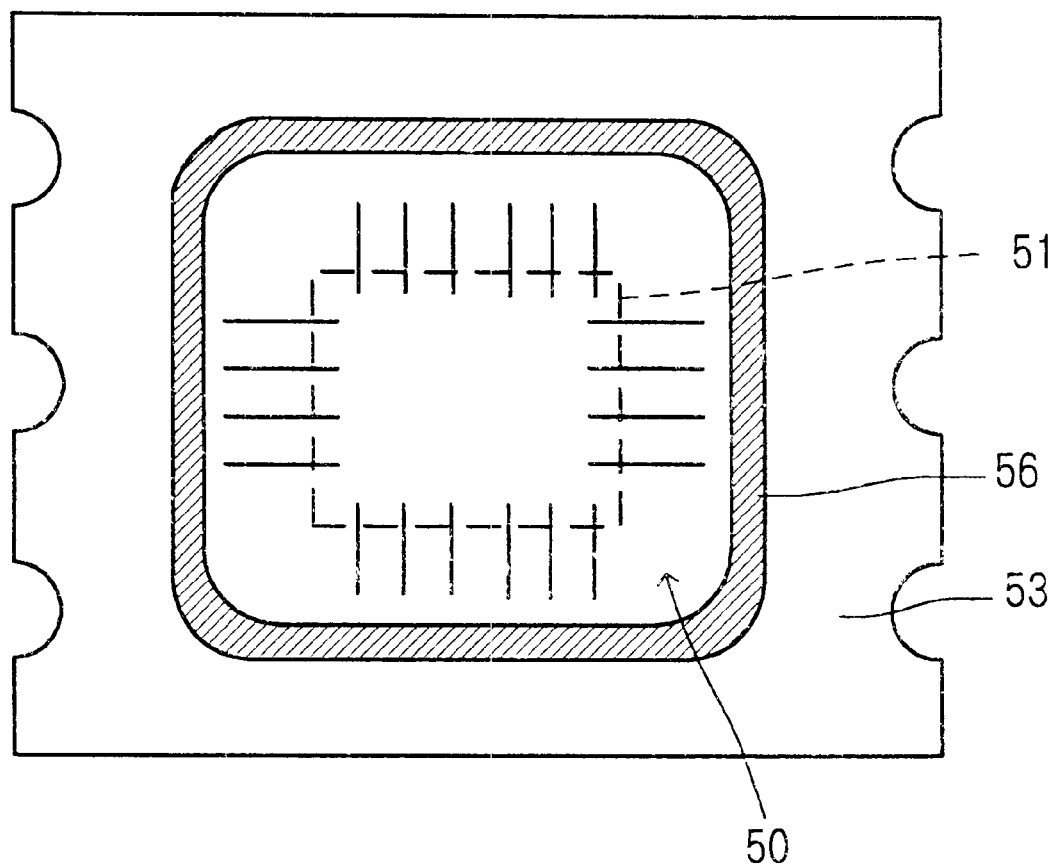
FIG. 17 is a plan view (partly cross section) showing the surface-acoustic-wave device package of the seventh preferred embodiment, shown in FIG. 15.

FIG. 15 is a cross-sectional view showing a surface-acoustic-wave (SAW) device package according to a seventh preferred embodiment of the present invention. FIG. 16 is an enlarged cross-sectional view showing portion "D" of the surface-acoustic-wave device package, shown in FIG. 15. FIG. 17 is a plan view showing the surface-acoustic-wave device package, shown in FIG. 15.

The SAW device package of this embodiment includes a piezoelectric substrate (SAW device) 51, a support frame 56, a cover film 57 and a seal material 60. The piezoelectric substrate 51 is connected to a base substrate 53 using bonding wires 52 with wire-bonding technique. In FIG. 16, a reference numeral 54 represents connecting pads ($1^{st}$ bonding portions) arranged on the edge of the functional surface of the piezoelectric substrate 51. The connecting pads 54 are connected via the bonding wires 52 to connecting pads ($2^{nd}$ bonding portions) 55 on the base substrate 53.

The piezoelectric substrate 51, mounted on the base substrate 53, is sealed with the seal material 60 to provide an air gap 50 above the functional surface of the piezoelectric substrate 51.

According to this embodiment, the cover film 57 is arranged between the piezoelectric substrate 51 and the seal material 60. The cover film 57 is provided over the piezoelectric substrate 51 so as to cover the SAW device (51) entirely. The cover film 57 is heated to be fixed onto the base substrate 53. The cover film 57 secures the air gap 50 to be provided above the piezoelectric substrate 51.

The support frame 56 is shaped to have a height that is almost the same as the highest point of the bonding wires 52. The support frame 56 is arranged to surround the piezoelectric substrate 51. The support frame 56 supports the weight of the cover film 57 to prevent the bonding wires 52 from being crushed. In this embodiment, the piezoelectric substrate 51 can be mounted onto the base substrate 53 with the bump bonding technique.

According to the seventh preferred embodiment of the invention, the bonding wires 52 are securely prevented from being crushed by mechanical pressure from the cover film 57.

Figure 18:
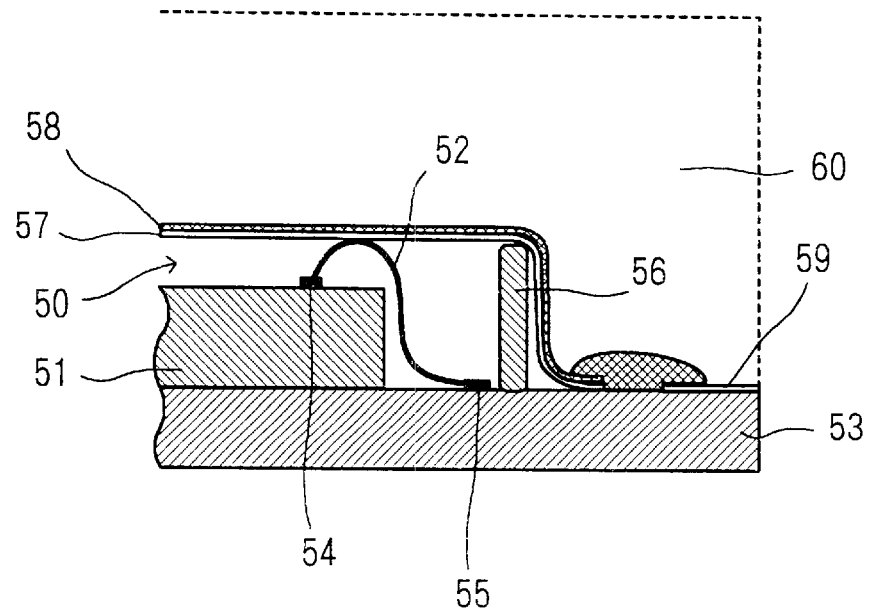
FIG. 18 is an enlarged cross-sectional view showing a part of a surface-acoustic-wave device package according to an eighth preferred embodiment of the present invention.

FIG. 18 is a cross-sectional view showing a part of a surface-acoustic-wave device package according to an eighth preferred embodiment of the present invention. This embodiment is created by modifying the above described seventh preferred embodiment. In this embodiment, the same or corresponding elements to those in the seventh preferred embodiment are represented by the same reference numerals. And the same explanation is not repeated to avoid a redundant description.

The feature of the eighth preferred embodiment is that a conductive layer 58 is formed on the cover film 57. The conductive layer 58 is electrically connected to a ground pattern 59, formed on the base substrate 53. The conductive layer 58, for example, is formed by spraying conductive coatings or by chemical plating to the outside surface of the cover film 57.

In addition to the advantages of the seventh preferred embodiment, according to the eighth preferred embodiment of the present invention, the cover film 57 can be grounded easily.

Figure 19:
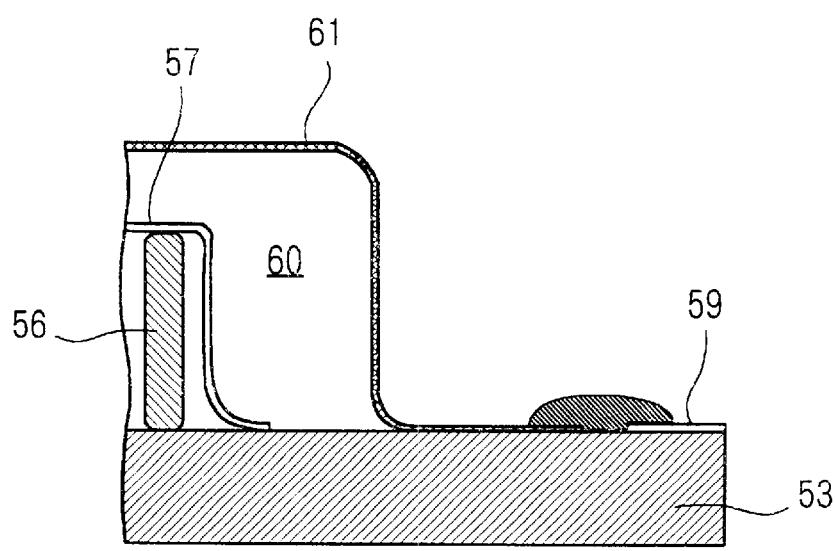
FIG. 19 is an enlarged cross-sectional view showing a part of a surface-acoustic-wave device package according to a ninth preferred embodiment of the present invention.

FIG. 19 is a cross-sectional view showing a part of a surface-acoustic-wave device package according to a ninth preferred embodiment of the present invention. This embodiment is created by modifying the above described seventh preferred embodiment. In this embodiment, the same or corresponding elements to those in the seventh preferred embodiment are represented by the same reference numerals. And the same explanation is not repeated to avoid a redundant description.

The feature of the embodiment is that a conductive layer 61 is formed on the seal material 60. The conductive layer 61 is electrically connected to a ground pattern 59, formed on the base substrate 53. The conductive layer 61 may be formed by evaporating or sputtering a conductive material to the outside surface of the seal material 60.

In addition to the advantages of the seventh preferred embodiment, according to the ninth preferred embodiment of the present invention, the seal material 60 can be grounded easily.

Figure 20:
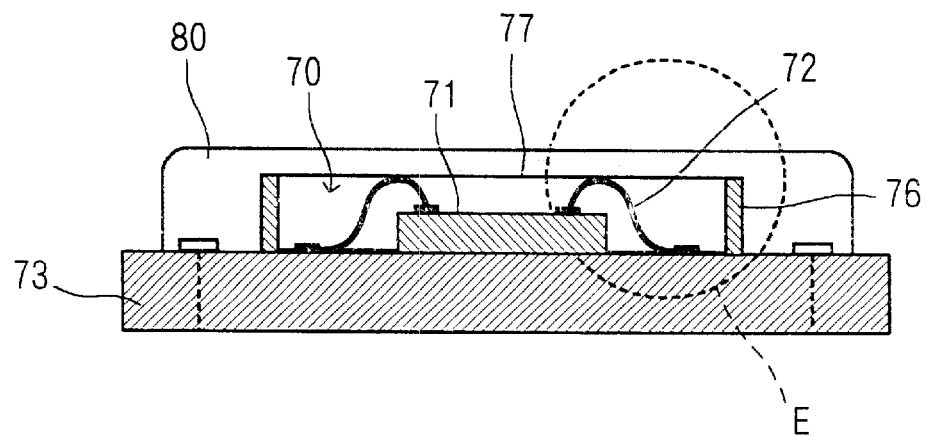
FIG. 20 is a cross-sectional view illustrating a surface-acoustic-wave device according to a tenth preferred embodiment of the present invention.
Figure 21:
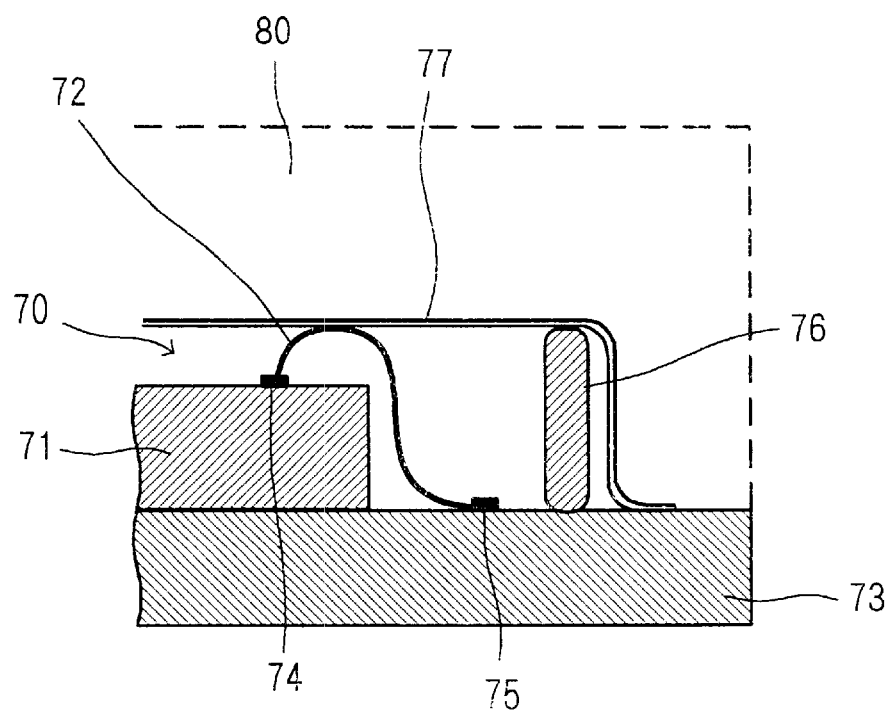
FIG. 21 is an enlarged cross-sectional view showing a region "E" FIG. 20.
Figure 22:
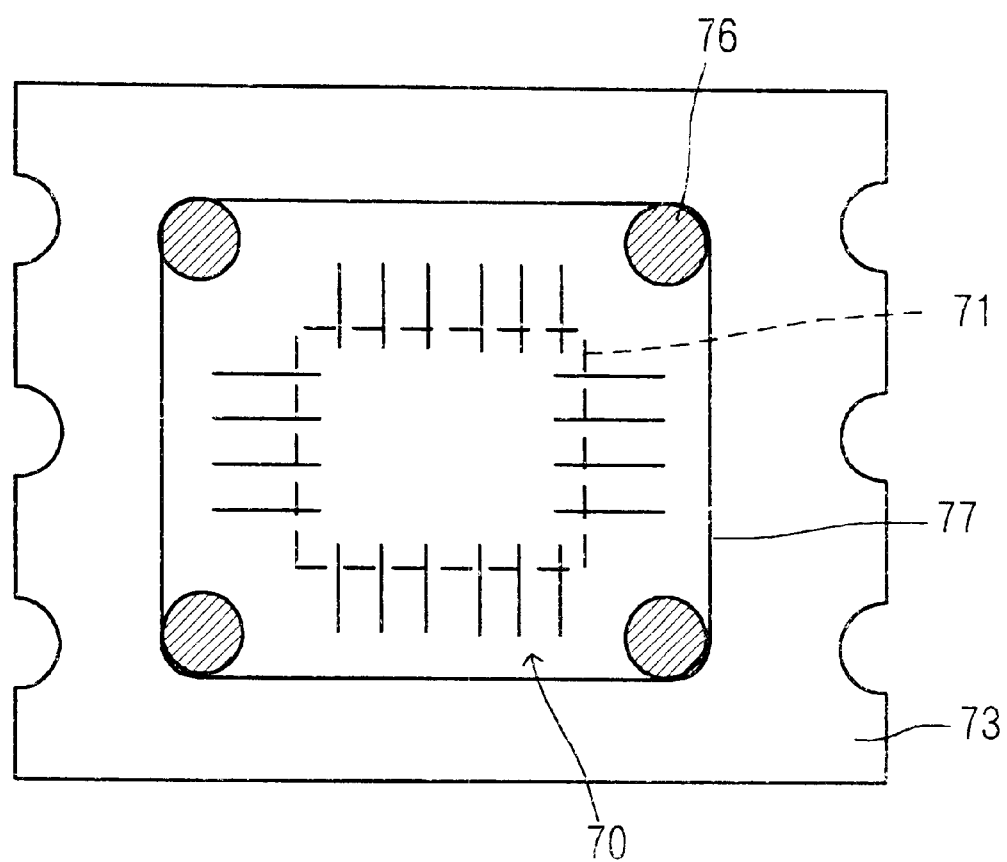
FIG. 22 is a plan view (partly cross section) showing the surface-acoustic-wave device package of the tenth preferred embodiment, shown in FIG. 20.

FIG. 20 is a cross-sectional view showing a surface-acoustic-wave (SAW) device package according to a tenth preferred embodiment of the present invention. FIG. 21 is an enlarged cross-sectional view showing portion "E" of the surface-acoustic-wave device package, shown in FIG. 20. FIG. 22 is a plan view showing the surface-acoustic-wave device package, shown in FIG. 19.

The SAW device package of this embodiment includes a piezoelectric substrate (SAW device) 71, four support props 76, a cover film 77 and a seal material 80. The piezoelectric substrate 71 is mounted on to a base substrate 73 using bonding wires 72 with wire-bonding technique. In FIG. 21, a reference numeral 74 represents connecting pads ($1^{st}$ bonding portions) arranged on the edge of the functional surface of the piezoelectric substrate 71. The connecting pads 74 are connected via the bonding wires 72 to connecting pads ($2^{nd}$ bonding portions) 75 on the base substrate 73.

The piezoelectric substrate 71, mounted on the base substrate 73, is sealed with the seal material 80 to provide an air gap 70 above the functional surface of the piezoelectric substrate 71.

According to this embodiment, the cover film 77 is arranged between the piezoelectric substrate 71 and the seal material 80. The cover film 77 is provided over the piezoelectric substrate 71 so as to cover the SAW device entirely. The cover film 77 is heated to be fixed onto the base substrate 73. The cover film 77 secures the air gap 70 to be provided above the piezoelectric substrate 71.

The support props 76 are arranged at the corners of the air gap 70. Each of the support props 76 is shaped to have a height that is almost the same as the highest point of the bonding wires 72. The support props 76 support the weight of the cover film 77 to prevent the bonding wires 72 from being crushed.

In this embodiment, the piezoelectric substrate 71 can be mounted onto the base substrate 73 with the bump bonding technique. The support props 76 can be arranged not only at the corners but other places. In other words, the positions of the support props 76 should be optimized so that the cover film 77 is supported properly in accordance with the positions of the bonding wires 72 and with the size and shape of the piezoelectric substrate 71.

According to the tenth preferred embodiment of the invention, the surface-acoustic-wave package includes the support props 76, so that the bonding wires 72 are securely prevented from being crushed by mechanical pressure from the cover film 77.

Figure 23:
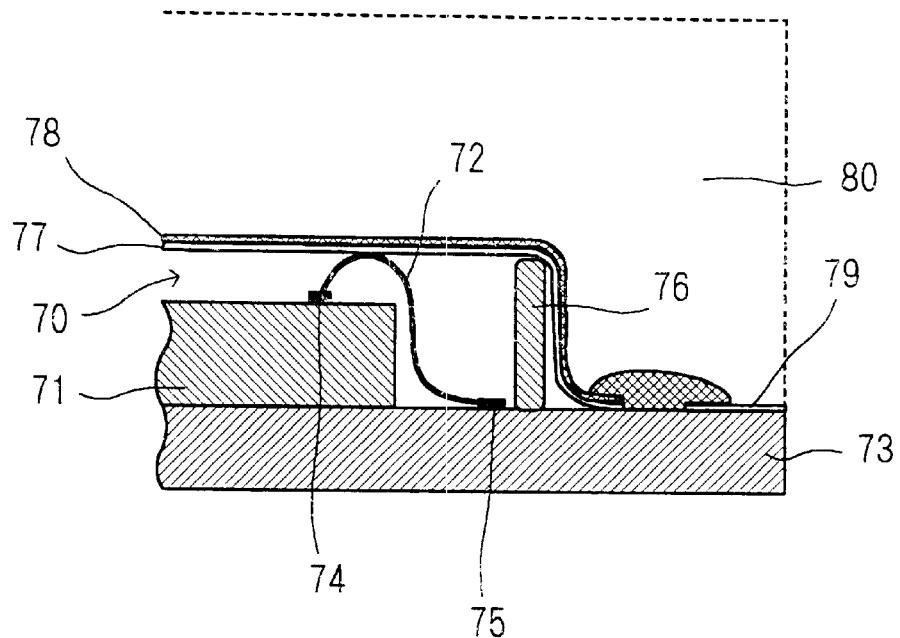
FIG. 23 is a cross-sectional view illustrating a surface-acoustic-wave device package according to an eleventh preferred embodiment of the present invention.

FIG. 23 is a cross-sectional view showing a part of a surface-acoustic-wave device package according to an eleventh preferred embodiment of the present invention. This embodiment is created by modifying the above described tenth preferred embodiment. In this embodiment, the same or corresponding elements to those in the tenth preferred embodiment are represented by the same reference numerals. And the same explanation is not repeated to avoid a redundant description.

The feature of the eleventh preferred embodiment is that a conductive layer 78 is formed on the cover film 77. The conductive layer 78 is electrically connected to a ground pattern 79, formed on the base substrate 73. The conductive layer 78, for example, is formed by spraying conductive coatings or by chemical plating to the outside surface of the cover film 77.

In addition to the advantages of the tenth preferred embodiment, according to the eleventh preferred embodiment of the present invention, the cover film 77 can be grounded easily.

Figure 24:
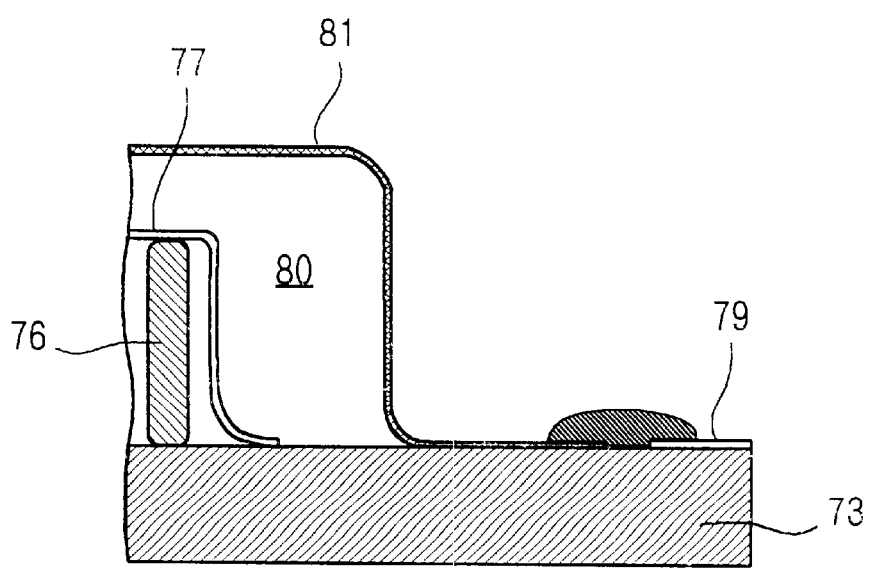
FIG. 24 is an enlarged cross-sectional view showing a part of a surface-acoustic-wave device package according to a twelfth preferred embodiment of the present invention.

FIG. 24 is a cross-sectional view showing a part of a surface-acoustic-wave device package according to a twelfth preferred embodiment of the present invention. This embodiment is created by modifying the above described tenth preferred embodiment. In this embodiment, the same or corresponding elements to those in the tenth preferred embodiment are represented by the same reference numerals. And the same explanation is not repeated to avoid a redundant description.

The feature of the embodiment is that a conductive layer 81 is formed on the seal material 80. The conductive layer 81 is electrically connected to a ground pattern 79, formed on the base substrate 73. The conductive layer 81 may be formed by evaporating or sputtering a conductive material to the outside surface of the seal material 80.

In addition to the advantages of the tenth preferred embodiment, according to the twelfth preferred embodiment of the present invention, the seal material 80 can be grounded easily.

Figure 25:
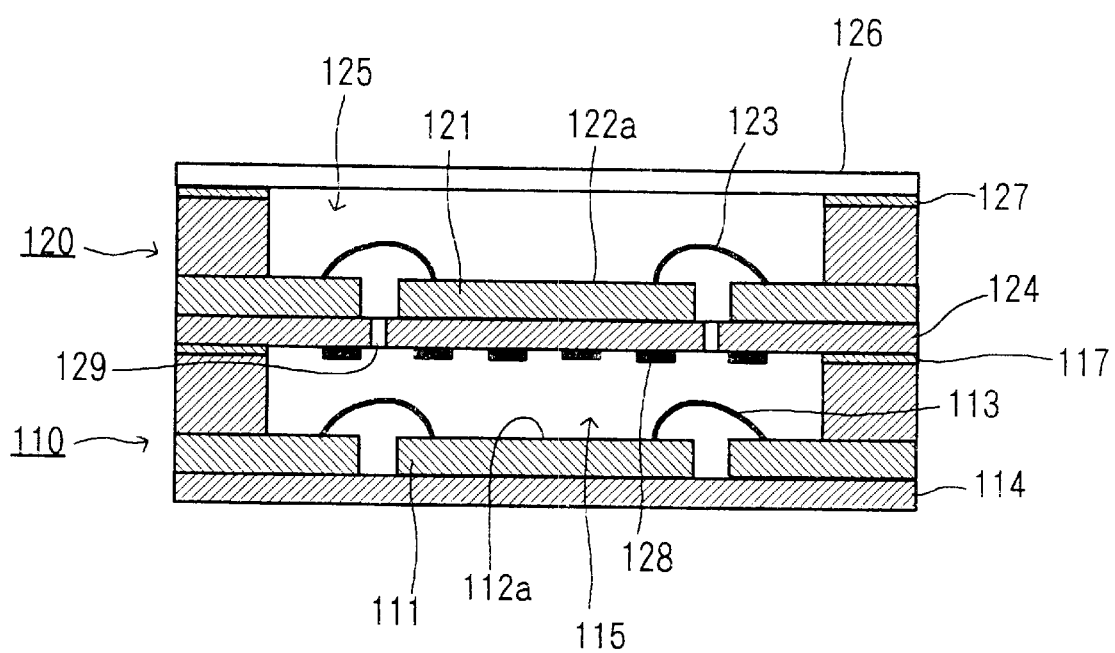
FIG. 25 is a cross-sectional view illustrating a surface-acoustic-wave device according to a thirteenth preferred embodiment of the present invention.
Figure 26:
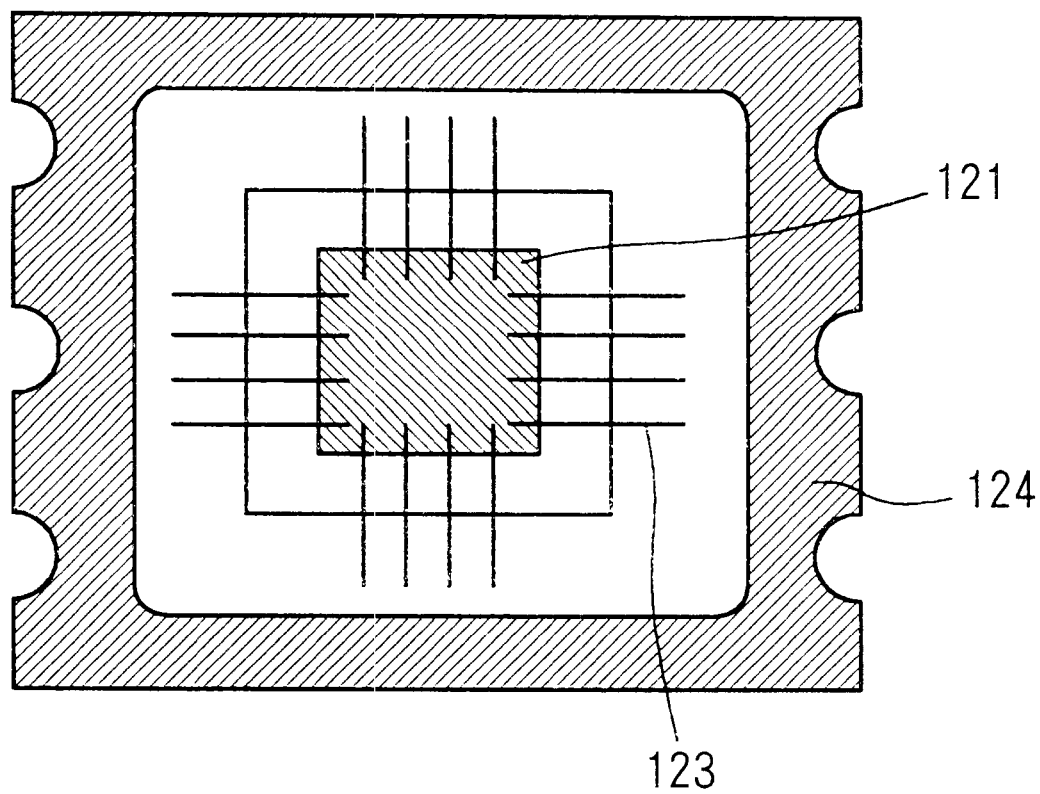
FIG. 26 is a plan view (partly cross section) showing the surface-acoustic-wave device package of the thirteenth preferred embodiment, shown in FIG. 25.
Figure 27:
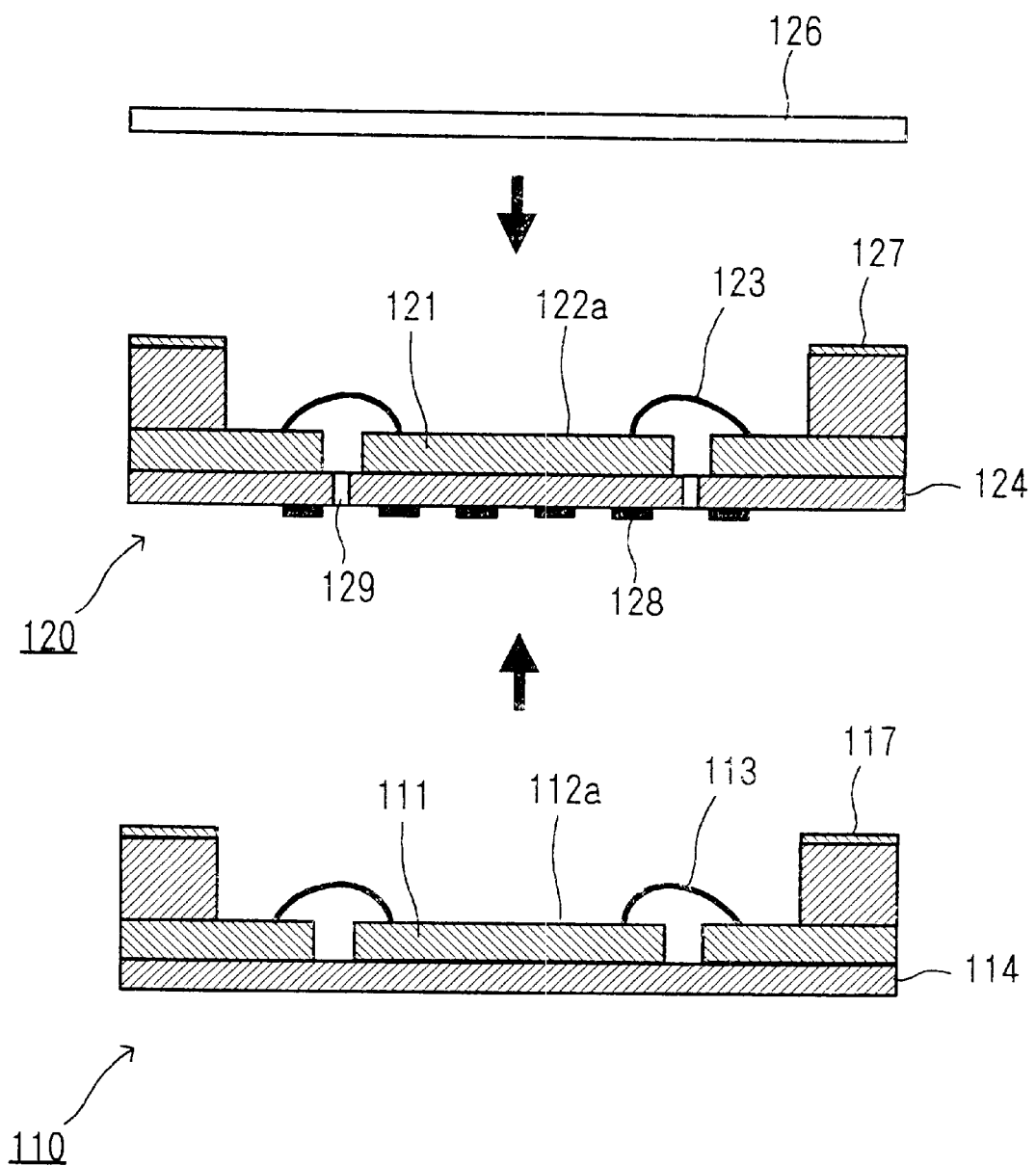
FIG. 27 is a cross sectional view showing packaging steps of the surface-acoustic-wave device of the thirteenth preferred embodiment, shown in FIG. 25.

FIG. 25 is a cross-sectional view showing a surface-acoustic-wave device package according to a thirteenth preferred embodiment of the present invention. FIG. 26 is a plan view showing the surface-acoustic-wave device package, shown in FIG. 25, in which the seal lid is not shown for easy understanding of the structure. FIG. 27 is a cross-sectional view (assembly diagram) showing the pieces forming the surface-acoustic-wave device package, shown in FIG. 25.

The surface-acoustic-wave (SAW) device package according to the thirteenth preferred embodiment is fabricated by putting one SAW device on top of one another. The SAW device package includes a first SAW device layer 110, a second SAW device layer 120, arranged onto the first SAW device layer 110, and a seal lid 126.

The first SAW device layer 110 includes a base substrate 114, a SAW device (piezoelectric substrate) 111 mounted on the base substrate 114, and a seal material 117. The SAW device 111 is mounted onto the base substrate 114 using bonding wires 113.

The second SAW device layer 120 includes a base substrate 124, a SAW device (piezoelectric substrate) 121 mounted on the base substrate 124, and a seal material 127. The SAW device 121 is mounted onto the base substrate 124 using bonding wires 123.

The first SAW device layer 110 is sealed with the seal material 117 and the base substrate 124 of the second SAW device layer 120 to provide an air gap above the functional surface 112*a* of the SAW device 111. In other words, the base substrate 124 of the second SAW device layer 120 is used as a seal lid. The second SAW device layer 120 is sealed with the seal material 127 and the seal lid 126 to provide an air gap above the functional surface 122*a* of the SAW device 121.

The base substrate 124 of the second SAW device layer 120 is provided at the bottom surface with a wiring pattern 128. The base substrate 124 is provided with non-fill-up type of through holes 129 therein. Because the second SAW device layer 120 is securely sealed with the seal lid 126, non-fill-up type of through holes can be used, which are formed easily as compared to fill-up type. The SAW devices 111 and 121 are electrically connected through the through holes 129 easily by platting or the like.

In fabrication, the SAW devices 111 and 121 are mounted on the base substrate 114 and 124, respectively. Next, the base substrate 124 with the SAW device 121 is put on the base substrate with the SAW device 114. Subsequently, the seal lid 126 is put onto the second SAW device layer 120 and the second SAW device layer 120 is sealed with the seal material 127.

According to this embodiment, more than two SAW device layers can be pilled up. Each of the third and up layers is structured in the same manner as the second SAW device layer 120. The number of devices formed on each base substrate is not limited by one, but can be more than one. A variety of types of devices, such as inductance, resistor and condenser can be mounted on the base substrates together with the SAW devices.

As described above, the thirteenth preferred embodiment of the present invention allows the wiring pattern 128 to be formed on the bottom of the base substrate 124. That is because the wiring pattern 128 is not interfered with patterns on the motherboard. In other words, this embodiment provides a three-dimension structure of SAW device package, so that the package can be manufactured to be small in size with lower cost. Further, the non-fill-up type of through holes can be provided in an upper device layer, because the SAW device package is entirely sealed.

What is claimed is:

1. A surface-acoustic-wave device package, comprising:
a base substrate;
a surface-acoustic-wave device mounted face-down on the base substrate, the device having a functional surface and a back surface opposite to the functional surface, the functional surface being spaced from the base substrate to define an air gap therebetween, the functional surface carrying traveling surface acoustic waves on the functional surface and the back surface is;
a cover-film provided on the back surface of the surface-acoustic wave device to cover the surface acoustic wave device so that surface acoustic waves can travel on the functional surface securely; and
a sealing material provided over the cover film so as to seal the surface-acoustic-wave device.

2. A surface-acoustic-wave device package, according to claim 1, wherein the cover film is an adhesive film positioned on the base substrate.

3. A surface-acoustic-wave device package, according to claim 1, wherein the cover film is formed of a thermo-softening material that sticks to the base substrate when heated.

4. A surface-acoustic-wave device package, according to claim 3, wherein
the cover film is made of vinyl resin.

5. A surface-acoustic-wave device package, according to claim 1, wherein the cover film includes a bonded polyester fabric permeated with acrylic resin.

6. A surface-acoustic-wave device package, according to claim 5, further comprising:
a conductive layer that is provided on the cover film to be electrically connected to a ground pattern, formed on the base substrate.

7. A surface-acoustic-wave device package, according to claim 1, further comprising a ground pattern formed on the base substrate, and a conductive layer on the seal material, electrically connected to the ground pattern on the base substrate.

8. A surface-acoustic-wave device package, comprising:
a surface-acoustic-wave device having a functional surface on which surface acoustic waves travel;
a cover film covering the surface-acoustic-wave device to secure an air gap around the functional surface, whereby surface acoustic waves travel securely on the functional surface;
a base substrate having a around pattern formed thereon;
a sealing material over the cover film, sealing the surface-acoustic-wave device;
bonding wires wire-bonding the surface-acoustic-wave device on the base substrate; and
a conductive layer formed over the sealing material to be electrically connected to the ground pattern formed on the base substrate.

9. A surface-acoustic-wave device package, according to claim 8, further comprising:
a supporting member that supports the cover film in order to prevent the bonding wires from being crushed.

10. A surface-acoustic-wave device package, according to claim 9, wherein
the supporting member is shaped to be a frame surrounding the surface-acoustic-wave device.

11. A surface-acoustic-wave device package, according to claim 9, wherein
the supporting member comprises at least four props arranged at the corners of a square surrounding the surface-acoustic-wave device.

12. A surface-acoustic-wave device package comprising:
a base substrate, said base substrate having
two wiring patterns formed respectively on opposite surfaces thereof, and
an electrically conductive throughhole therein, electrically connecting the two wiring patterns to each other;
first through Nth surface-acoustic-wave (SAW) device layers ("N" being a whole number larger than one), piled successively on one another, each having a corresponding SAW device, wherein the first SAW device layer comprises a first SAW device having a functional surface on which surface acoustic waves travel and a bottom surface connected to the base substrate, and wherein the SAW device of the Nth SAW device layer has a functional surface on which surface acoustic waves travel; and
a sealing lid arranged over the Nth SAW device layer to provide a sealed air gap above the functional surface of the Nth SAW device, wherein
a bottom surface of the SAW device of the Nth SAW device layer functions as a seal to provide a sealed air gap above the functional surface of the SAW device of the (N−1)th SAW device layer, and
the SAW device of the Nth SAW device layer is formed with a conductive pattern on the bottom surface.

13. A surface-acoustic-wave device package, according to claim 12 wherein the SAW device of the Nth SAW device layer has a though hole therein.

* * * * *

UNITED STATES PATENT AND TRADEMARK OFFICE
CERTIFICATE OF CORRECTION

| | | |
|---|---|---|
| PATENT NO. | : 6,329,739 B1 | Page 1 of 1 |
| APPLICATION NO. | : 09/302422 | |
| DATED | : December 11, 2001 | |
| INVENTOR(S) | : Masayuki Sawano | |

It is certified that error appears in the above-identified patent and that said Letters Patent is hereby corrected as shown below:

IN THE TITLE ITEM (54) and column 1:

The title should be corrected to read: "SURFACE-ACOUSTIC WAVE DEVICE PACKAGE"

Signed and Sealed this
Nineteenth Day of June, 2012

David J. Kappos
*Director of the United States Patent and Trademark Office*